(12) United States Patent
Chen et al.

(10) Patent No.: US 11,265,101 B2
(45) Date of Patent: Mar. 1, 2022

(54) ENCODING METHOD, DECODING METHOD, APPARATUS, AND DEVICE

(71) Applicant: Huawei Technologies Co., Ltd., Shenzhen (CN)

(72) Inventors: Ying Chen, Hangzhou (CN); Gongzheng Zhang, Hangzhou (CN); Hejia Luo, Hangzhou (CN); Rong Li, Hangzhou (CN); Yue Zhou, Hangzhou (CN)

(73) Assignee: Huawei Technologies Co., Ltd, Shenzhen (CN)

( * ) Notice: Subject to any disclaimer, the term of this patent is extended or adjusted under 35 U.S.C. 154(b) by 0 days.

(21) Appl. No.: 16/786,488

(22) Filed: Feb. 10, 2020

(65) Prior Publication Data
US 2020/0195373 A1    Jun. 18, 2020

Related U.S. Application Data

(63) Continuation of application No. PCT/CN2018/100224, filed on Aug. 13, 2018.

(30) Foreign Application Priority Data

Aug. 11, 2017    (CN) .......................... 201710687048.8

(51) Int. Cl.
H04L 1/00    (2006.01)

(52) U.S. Cl.
CPC .......... *H04L 1/0013* (2013.01); *H04L 1/0042* (2013.01); *H04L 1/0047* (2013.01)

(58) Field of Classification Search
CPC ... H04L 1/0013; H04L 1/0042; H04L 1/0047; H04L 1/0057; H04L 1/00; H04L 1/0033;
(Continued)

(56) References Cited

U.S. PATENT DOCUMENTS

2016/0248547 A1    8/2016    Shen et al.
2016/0269050 A1    9/2016    Shen et al.
(Continued)

FOREIGN PATENT DOCUMENTS

CA    2972832 A1    7/2015
CN    106817195 A    6/2017
(Continued)

OTHER PUBLICATIONS

Mediatek Inc., "Polar Code Size and Rate-Matching Design for NR Control Channels", 3GPP TSG RAN WG1 RAN1 #88 Meeting R1-1702735, Feb. 13-17, 2017, 8 pages, Athens, Greece.
(Continued)

Primary Examiner — Thien Nguyen
(74) Attorney, Agent, or Firm — Slater Matsil, LLP

(57) ABSTRACT

Embodiments of the present disclosure provide a rate matching method and an apparatus. The method includes performing, by a sending apparatus, encoding using a polar code to obtain a first encoded sequence whose length is N. A sequence number of a polarization channel may range from 0 to N−1. The method includes determining, by the sending apparatus, P1 to-be-punctured bit positions. The method includes performing puncturing at the P1 bit positions in the first encoded sequence to obtain rate-matched encoded bits. The P1 to-be-punctured bit positions are bit positions corresponding to polarization channels 0 to $P_{T1}-1$, $P_{T1}$ to $3N/8-1$, and/or $N/2$ to $5N/8-1$, $P_{T1}$ is a threshold of a quantity of to-be-punctured bit positions, and $P_{T1} \le N/4$. The method includes sending the rate-matched encoded bits.

20 Claims, 6 Drawing Sheets

(58) Field of Classification Search
CPC . H03M 13/13; H03M 13/6362; H03M 13/618
See application file for complete search history.

(56) References Cited

U.S. PATENT DOCUMENTS

| | | | | |
|---|---|---|---|---|
| 2016/0308644 | A1* | 10/2016 | Shen | H03M 13/6306 |
| 2017/0149528 | A1 | 5/2017 | Kim et al. | |
| 2017/0366205 | A1* | 12/2017 | Zhang | H03M 13/635 |
| 2018/0026663 | A1* | 1/2018 | Wu | H03M 13/6362 714/776 |
| 2019/0349002 | A1* | 11/2019 | Zhou | H03M 13/09 |

FOREIGN PATENT DOCUMENTS

| | | |
|---|---|---|
| CN | 106877973 A | 6/2017 |
| CN | 105493424 B | 2/2019 |
| CN | 105164956 B | 5/2019 |
| WO | 2015100561 A1 | 7/2015 |

OTHER PUBLICATIONS

Huawei et al.,"Polar codes—encoding and decoding", 3GPP TSG RAN WG1 Meeting #xx, R1-164039, Nanjing, China, May 23-27, 2016, 7 pages.

Ericsson, "Rate Matching Schemes for Polar Codes", 3GPP TSG-RAN WG1 #88bis, R1-1704317, Apr. 3-7, 2017, 3 pages, XP051251125, Spokane, U.S.

Huawei et al., "Polar code design and rate matching", 3GPP TSG RAN WG1 Meeting #86, R1-167209, Aug. 22-26, 2016, 6 pages, XP051142532, Gothenburg, Sweden.

NTT Docomo, "Discussion on construction of Polar codes", 3GPP TSG RAN WG1 Meeting #88, R1-1702850,12 Feb. 13-17, 2017, 10 pages, XP051209995, Athens, Greece.

* cited by examiner

701. A sending apparatus performs encoding by using a polar code polar, to obtain a first encoded sequence whose length is N, where a sequence number of a polarization channel may range from 0 to N−1

703. The sending apparatus determines P1 to-be-punctured bit positions or P2 to-be-shortened bit positions, and performs puncturing at the P1 bit positions or performs shortening at the P2 bit positions in the first encoded sequence to obtain rate-matched encoded bits 705. Send the rate-matched encoded bits

FIG. 7

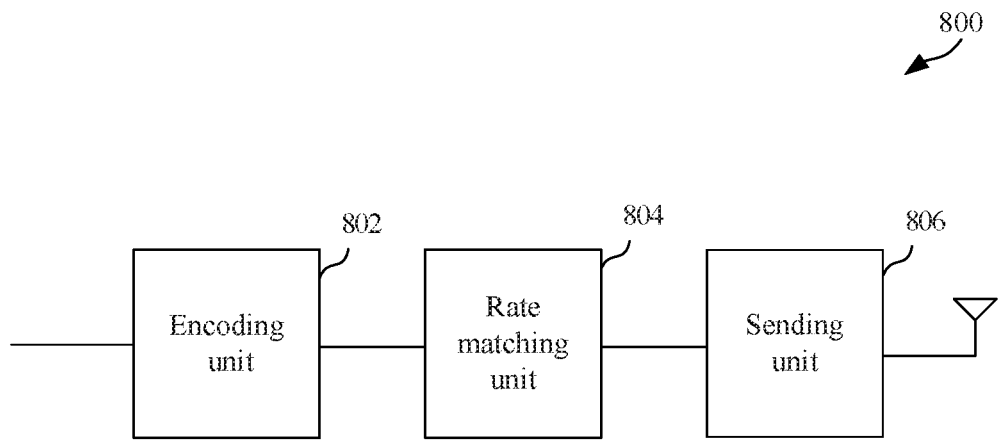

FIG. 8

ENCODING METHOD, DECODING METHOD, APPARATUS, AND DEVICE

CROSS-REFERENCE TO RELATED APPLICATIONS

This application is a continuation of International Application No. PCT/CN2018/100224, filed on Aug. 13, 2018, which claims priority to Chinese Patent Application No. 201710687048.8, filed on Aug. 11, 2017. The disclosures of the aforementioned applications are incorporated by reference in their entireties.

TECHNICAL FIELD

The present disclosure relates to the field of communications technologies, and in particular, to a rate matching method and an apparatus.

BACKGROUND

Data transmission reliability is usually improved in a communications system through channel encoding, to ensure communication quality. It has been theoretically proved that a polar code put forward by Arikan, a Turkish professor, is the first code that can achieve a Shannon capacity and that has low encoding and decoding complexity. The polar code is a linear block code, and has an encoding matrix $G_N$. An encoding process is $x_1^N = u_1^N G_N$. $u_1^N = (u_1, u_2, \ldots, u_N)$ is a binary row vector, and has a length N (namely, a length of a mother code); $G_N$ is a matrix N×N, and $G_N = F_2^{\oplus(\log_2(N))}$. $F_2^{\oplus(\log_2(N))}$ is defined as a Kronecker product of $\log_2^N$ matrices $F_2$. The matrix is $$F_2 = \begin{bmatrix} 1 & 0 \\ 1 & 1 \end{bmatrix}.$$

In the encoding process of the polar code, some bits in $u_1^N$ are used to carry information, and are referred to as information bits, and a set of indexes of these bits is denoted as A; and the other bits are set to fixed values on which a transmit end and a receive end pre-agree, and are referred to as fixed bits or frozen bits (frozen bits), and a set of indexes of these bits is represented by a complementary set $A^c$ of A. The encoding process of the polar code is equivalent to $x_1 = u_A G_N(A) \oplus u_{A^c} G_N(A^c)$. Herein, $G_N(A)$ is a submatrix that is obtained based on rows corresponding to the indexes in the set A and that is in $G_N$, and $G_N(A^C)$ is a submatrix that is obtained based on rows corresponding to the indexes in the set $A^C$ and that is in $G_N$. $u_A$ is a set of the information bits in $u_1^N$, and a quantity of information bits is K. $u_{A^c}$ is a set of the frozen bits in $u_1^N$, a quantity of frozen bits is N−K, and the frozen bits are known bits. These frozen bits are usually set to 0. However, the frozen bits may be set freely, provided that the transmit end and the receive end pre-agree on this. When the frozen bits are set to 0, an encoding output of the polar code may be simplified as $x_1^N = u_A G_N(A)$, and is a matrix K×N.

A construction process of the polar code is a selection process of the set A, and determines performance of the polar code. The construction process of the polar code is usually as follows: It is determined, based on the code length N of the mother code, that N polarization channels in total exist, the N polarization channels respectively correspond to N rows of the encoding matrix, reliability of the polarization channels is calculated, indexes of first K polarization channels having highest reliability are used as elements of the set A, and indexes corresponding to the remaining N−K polarization channels are used as elements of the set $A^c$ of the indexes of the frozen bits. The set A determines positions of the information bits, and the set $A^c$ determines positions of the frozen bits.

It may be learned from the encoding matrix that a code length of an original polar code (a mother code) is the integral power of 2. During actual application, a polar code of any length needs to be implemented through rate matching.

In conventional systems, rate matching is implemented using a puncturing (puncture) or shortening (shorten) solution. In conventional systems, during encoding, a mother code whose code length exceeds a target code length is always punctured or shortened, so that the code length of the mother code reaches the target code length; during decoding, the mother code is filled and restored, so that the target code length is restored to the code length of the mother code. When a mother code has a relatively large quantity of information bits, a rate matching manner in which the mother code is directly punctured/shortened causes a performance loss.

SUMMARY

In view of this, embodiments of this application provide a rate matching method and an apparatus, to avoid a performance loss in a puncturing/shortening process.

According to a first aspect, an embodiment of the present disclosure provides a rate matching method that includes performing, by a sending apparatus, encoding using a polar code, to obtain a first encoded sequence whose length is N, where a sequence number of a polarization channel may range from 0 to N−1. The method includes determining, by the sending apparatus, P1 to-be-punctured bit positions, and includes performing puncturing at the P1 bit positions in the first encoded sequence to obtain rate-matched encoded bits. The P1 to-be-punctured bit positions are bit positions corresponding to polarization channels 0 to PT1−1, PT1 to 3N/8−1, and/or N/2 to 5N/8−1, PT1 is a threshold of a quantity of to-be-punctured bit positions, and PT1≤N/4. The method includes sending the rate-matched encoded bits.

According to a second aspect, an embodiment of the present disclosure provides a sending apparatus that includes an encoding unit, a rate matching unit, and a sending unit. The encoding unit is configured to perform encoding using a polar code polar to obtain a first encoded sequence whose length is N. A sequence number of a polarization channel may range from 0 to N−1. The rate matching unit is configured to determine P1 to-be-punctured bit positions, and to perform puncturing at the P1 bit positions in the first encoded sequence to obtain rate-matched encoded bits. The P1 to-be-punctured bit positions are bit positions corresponding to polarization channels 0 to PT1−1, PT1 to 3N/8−1, and/or N/2 to 5N/8−1, PT1 is a threshold of a quantity of to-be-punctured bit positions, and PT1≤N/4. The sending unit is configured to send the rate-matched encoded bits.

Optionally, the sending apparatus may be a chip or an integrated circuit.

In a possible design, when some or all of the functions are implemented using software, the sending apparatus includes: a memory, configured to store a program; and a processor, configured to execute the program stored in the memory, where when the program is executed, the sending apparatus may implement the method in any one of the first aspect or the possible designs of the first aspect.

Optionally, the memory may be a physically independent unit, or may be integrated with the processor.

In a possible design, when some or all of the functions are implemented using software, the sending apparatus includes a processor. The memory configured to store the program is located outside the sending apparatus. The processor is connected to the memory using a circuit/wire, and is configured to read and execute the program stored in the memory.

In a possible design, $P_{T1}$ is N/16, N/8, 3N/16, 7N/32, 5N/32, or 3N/32.

In a possible design, if P1 is greater than $P_{T1}$: the P1 to-be-punctured bit positions are bit positions corresponding to polarization channels 0 to PT1−1, and bit positions corresponding to P1−$P_{T1}$ polarization channels that have lowest reliability among polarization channels $P_{T1}$ to 3N/8−1 and/or N/2 to 5N/8−1; or the P1 to-be-punctured bit positions are bit positions corresponding to polarization channels 0 to $P_{T1}$−1, and bit positions corresponding to P1−$P_{T1}$ polarization channels included in K1 groups that have lowest reliability among S1 groups of polarization channels including polarization channels $P_{T1}$ to 3N/8−1 and/or N/2 to 5N/8−1; or the P1 to-be-punctured bit positions are bit positions corresponding to polarization channels 0 to $P_{T1}$−1, and bit positions corresponding to P1−$P_{T1}$ polarization channels included in K2 groups that have a lowest code weight among S2 groups of polarization channels including polarization channels $P_{T1}$ to 3N/8−1 and/or N/2 to 5N/8−1.

In a possible design, if a value of N/2−$P_{T1}$ is divisible by S1, a quantity of polarization channels included in each of the S1 groups is (N/2−$P_{T1}$)/S1. In a possible design, if a value of N/2−$P_{T1}$ is indivisible by S1, a quantity of polarization channels included in one of the S1 groups is (N/2−$P_{T1}$)−floor((N/2−$P_{T1}$)/S1)*(S1−1) or (N/2−$P_{T1}$)−ceil((N/2−$P_{T1}$)/S1)*(S1−1), and a quantity of polarization channels included in each of the other S1−1 groups is floor((N/2−$P_{T1}$)/S1) or ceil((N/2−$P_{T1}$)/S1), where floor(i) represents rounding i down, and ceil(j) represents rounding j up. In a possible design, if a value of N/2−$P_{T1}$ is indivisible by S1, a quantity of polarization channels included in each of S1' groups is ceil((N/2−$P_{T1}$)/S1), and a quantity of polarization channels included in each of S1" groups is floor((N/2−$P_{T1}$)/S1), where S2"=ceil((N/2−$P_{T1}$)/S1*S1−(N/2−$P_{T1}$), and S1'=S1−S1."

In a possible design, the to-be-punctured bit positions are the bit positions corresponding to the polarization channels 0 to $P_{T1}$−1, bit positions corresponding to all polarization channels in K1−$K_{n1}$ groups that have lowest reliability among the K1 groups, and bit positions corresponding to P1−$P_{T1}$−$P_{n1}$ polarization channels in $K_{n1}$ groups that have highest reliability among the K1 groups. $K_{n1}$ is greater than or equal to 0 and less than or equal to K1, $P_{n1}$ is a quantity of all polarization channels in the K1−$K_{n1}$ groups, and the P1−$P_{T1}$−$P_{n1}$ polarization channels are selected from the $K_{n1}$ groups randomly or in an order. If a quantity of polarization channels included in the K1 groups is equal to P1−$P_{T1}$, $K_{n1}$ is equal to 0, and P1−$P_{T1}$−$P_{n1}$=0.

In a possible design, the to-be-punctured bit positions are the bit positions corresponding to the polarization channels 0 to $P_{T1}$−1, bit positions corresponding to all polarization channels in K2−$K_{n2}$ groups that have a lowest code weight among the K2 groups, and bit positions corresponding to P1−$P_{T1}$−$P_{n2}$ polarization channels in $K_{n2}$ groups that have highest code weight among the K2 groups. $K_{n2}$ is greater than or equal to 0 and less than or equal to K2, $P_{n2}$ is a quantity of all polarization channels in the K2$K_{n2}$ groups, and the P1−$P_{T1}$−$P_{n2}$ polarization channels are selected from the $K_{n2}$ groups randomly or in ascending order of sequence numbers of the polarization channels. If a quantity of polarization channels included in the K2 groups is equal to P1−$P_{T1}$, $K_{n2}$ is equal to 0, and P1−$P_{T1}$−$P_{n2}$=0.

In a possible design, if P1 is less than or equal to $P_{T1}$, the P1 to-be-punctured bit positions are bit positions corresponding to polarization channels 0 to P1−1.

According to a third aspect, an embodiment of the present disclosure provides a rate matching method that includes performing, by a sending apparatus, encoding using a polar code to obtain a first encoded sequence whose length is N. A sequence number of a polarization channel may range from 0 to N−1. The method includes determining, by the sending apparatus, P2 to-be-shortened bit positions, and includes performing puncturing at the P2 bit positions in the first encoded sequence to obtain rate-matched encoded bits. The P2 to-be-shortened bit positions are bit positions corresponding to polarization channels N−1 to N−PT2, N−PT2−1 to 5N/8, and/or N/2−1 to 3N/8, PT2 is a threshold of a quantity of to-be-shortened bit positions, and PT2≤N/4. The method includes sending the rate-matched encoded bits.

According to a fourth aspect, an embodiment of the present disclosure provides a sending apparatus that includes an encoding unit, a rate matching unit, and a sending unit. The encoding unit is configured to perform encoding using a polar code to obtain a first encoded sequence whose length is N. A sequence number of a polarization channel may range from 0 to N−1. The rate matching unit is configured to determine P2 to-be-shortened bit positions and perform shortening at the P2 bit positions in the first encoded sequence to obtain rate-matched encoded bits. The P2 to-be-shortened bit positions are bit positions corresponding to polarization channels N−1 to N−PT2, N−PT2−1 to 5N/8, and/or N/2−1 to 3N/8, PT2 is a threshold of a quantity of to-be-shortened bit positions, and PT2≤N/4. The sending unit is configured to send the rate-matched encoded bits.

Optionally, the sending apparatus may be a chip or an integrated circuit.

In a possible design, when some or all of the functions are implemented using software, the sending apparatus includes a memory and a processor. The memory is configured to store a program. The processor is configured to execute the program stored in the memory. When the program is executed, the sending apparatus may implement the method in any one of the first aspect or the possible designs of the first aspect.

Optionally, the memory may be a physically independent unit, or may be integrated with the processor.

In a possible design, when some or all of the functions are implemented using software, the sending apparatus includes a processor. The memory configured to store the program is located outside the sending apparatus. The processor is connected to the memory using a circuit/wire, and is configured to read and execute the program stored in the memory.

In a possible design, $P_{T2}$ is N/16, N/8, 3N/16, 7N/32, 5N/32, or 3N/32.

In a possible design, if P2 is greater than $P_{T2}$: the P2 to-be-shortened bit positions are bit positions corresponding to polarization channels N−1 to N−$P_{T2}$, and bit positions corresponding to P2−$P_{T2}$ polarization channels that have highest reliability among polarization channels N−$P_{T2}$−1 to 5N/8 and/or N/2−1 to 3N/8; or the P2 to-be-shortened bit positions are bit positions corresponding to polarization channels N−1 to N−$P_{T2}$, and bit positions corresponding to P2−$P_{T2}$ polarization channels included in K3 groups that have highest reliability among S3 groups of polarization channels including polarization channels N−$P_{T2}$−1 to 5N/8 and/or N/2−1 to 3N/8; or the P2 to-be-shortened bit positions are bit positions corresponding to polarization channels N−1 to N−$P_{T2}$, and bit positions corresponding to P2−$P_{T2}$ polarization channels included in K4 groups that have a highest code weight among S4 groups of polarization channels including polarization channels N−$P_{T2}$−1 to 5N/8 and/or N/2−1 to 3N/8.

In a possible design, if a value of N/2−$P_{T2}$ is divisible by S3, a quantity of polarization channels included in each of the S3 groups is (N/2−$P_{T2}$)/S3. In a possible design, if a value of N/2−$P_{T2}$ is indivisible by S3, a quantity of polarization channels included in one of the S3 groups is (N/2−$P_{T2}$)−floor((N/2−$P_{T2}$)/S3)*(S3−1) or (N/2−$P_{T2}$)−ceil((N/2−$P_{T2}$)/S3)*(S3−1), and a quantity of polarization channels included in each of the other S3−1 groups is floor((N/2−$P_{T2}$)/S3) or ceil((N/2−$P_{T2}$)/S3), where floor(i) represents rounding i down, and ceil(j) represents rounding j up. In a possible design, if a value of N/2−$P_{T2}$ is indivisible by S3, a quantity of polarization channels included in each of S3' groups is ceil((N/2−$P_{T2}$)/S3), and a quantity of polarization channels included in each of S3" groups is floor((N/2−$P_{T2}$)/S3), where S3"=ceil((N/2−$P_{T2}$)/S3)*S3−(N/2−$P_{T2}$), and S3'=S3−S3."

In a possible design, the to-be-shortened bit positions are the bit positions corresponding to the polarization channels N−1 to N−$P_{T2}$, bit positions corresponding to all polarization channels in K3−$K_{n3}$ groups that have highest reliability among the K3 groups, and bit positions corresponding to P2−$P_{T2}$−$P_{n3}$ polarization channels in $K_{n3}$ groups that have lowest reliability among the K3 groups. $K_{n3}$ is greater than or equal to 0 and less than or equal to K3, $P_{n3}$ is a quantity of all polarization channels in the K3−$K_{n3}$ groups, and the P2−$P_{T2}$−$P_{n3}$ polarization channels are selected from the $K_{n3}$ groups randomly or in an order. If a quantity of polarization channels included in the K3 groups is equal to P2−$P_{T2}$, $K_{n3}$ is equal to 0, and P2−$P_{T2}$−$P_{n3}$=0.

In a possible design, the to-be-shortened bit positions are the bit positions corresponding to the polarization channels N−1 to N−$P_{T2}$, bit positions corresponding to all polarization channels in K4−$K_{n4}$ groups that have a highest code weight among the K4 groups, and bit positions corresponding to P2−$P_{T2}$−$P_{n4}$ polarization channels in $K_{n4}$ groups that have a lowest code weight among the K4 groups. $K_{n4}$ is greater than or equal to 0 and less than or equal to K4, $P_{n4}$ is a quantity of all polarization channels in the K4−$K_{n4}$ groups, and the P2−$P_{T2}$−$P_{n4}$ polarization channels may be selected from the $K_{n4}$ groups randomly or in descending order of sequence numbers of the polarization channels. If a quantity of polarization channels included in the K4 groups is equal to P2−$P_{T2}$, $K_{n4}$ is equal to 0, and P2−$P_{T2}$−$P_{n4}$0.

In a possible design, if P2 is less than or equal to $P_{T2}$, the P2 to-be-shortened bit positions are bit positions corresponding to polarization channels N−1 to N−2.

According to a fifth aspect, a communications system is provided. The communications system includes a sending apparatus and a receiving apparatus. The sending apparatus may perform the method in any one of the first aspect or the possible designs of the first aspect, or the method in any one of the third aspect or the possible designs of the third aspect.

According to a sixth aspect, a computer storage medium is provided. The computer storage medium stores a computer program. The computer program includes an instruction used to perform the method in any one of the first aspect or the possible designs of the first aspect, or an instruction used to perform the method in any one of the third aspect or the possible designs of the third aspect.

According to a seventh aspect, an embodiment of this application provides a computer program product including an instruction. When the instruction is run on a computer, the computer is enabled to perform the method in each of the foregoing aspects.

BRIEF DESCRIPTION OF THE DRAWINGS

FIG. 7 is a flowchart of a rate matching method according to an embodiment of the present disclosure;

FIG. 8 is a schematic diagram of a sending apparatus according to an embodiment of the present disclosure;

DETAILED DESCRIPTION OF ILLUSTRATIVE EMBODIMENTS

The following further describes specific embodiments of this application in detail with reference to accompanying drawings.

Figure 1:
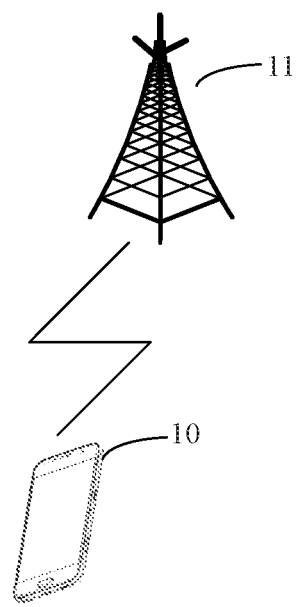
FIG. 1 is a schematic diagram of a wireless communications system to which an embodiment of the present disclosure is applicable.

FIG. 1 shows a wireless communications system to which an embodiment of this application is applicable. The wireless communications system may include at least one network device 11, and the network device 11 communicates with one or more terminals 10. The network device may be a base station, or may be a device obtained after a base station integrates with a base station controller, or may be another device having a similar communication function. The network device may be connected to a core network device.

It should be noted that the wireless communications system mentioned in this embodiment of this application includes, but is not limited to, a narrowband-Internet of things (NB-IoT) system, a Global System for Mobile Communications (GSM), an enhanced data rate for GSM evolution (EDGE) system, a wideband code division multiple access (WCDMA) system, a code division multiple access 2000 (CDMA2000) system, a time division-synchronous code division multiple access (TD-SCDMA) system, a long term evolution (LTE) system, and three application scenarios: enhanced mobile broadband (eMBB), ultra-reliable low latency (URLLC), and enhanced machine-type communications (eMTC) of a next generation 5G mobile communications system.

In this embodiment of this application, the network device is an apparatus that is deployed in a radio access network and that provides a wireless communication function for the terminal. The network device may include base stations in various forms, such as a macro base station, a micro base station (also referred to as a small cell), a relay station, and an access point. Names of devices having a base station function may be different in systems using different radio access technologies. For example, a device having a base station function is referred to as an evolved NodeB (eNB, or eNodeB) in the LTE system, a NodeB in a 3rd generation (3G) system, or the like. For ease of description, in all the embodiments of this application, the apparatuses providing the wireless communication function for the terminal are collectively referred to as a network device, a base station, or a BS.

The terminal used in this embodiment of this application may include various devices having a wireless communication function, such as a handheld device, an in-vehicle device, a wearable device, a computing device, and another processing device connected to a wireless modem. The terminal may be an mobile station (MS), a subscriber unit, a cellular phone, a smart phone, a wireless data card, a personal digital assistant (PDA) computer, a tablet computer, a wireless modem, a handset, a laptop computer, a machine type communication (MTC) terminal, or the like.

The network device in FIG. 1 communicates with the terminal using a radio technology. When the network device sends a signal, the network device is a transmit end. When the network device receives a signal, the network device is a receive end. This case is also applicable to the terminal. When the terminal sends a signal, the terminal is a transmit end. When the terminal receives a signal, the terminal is a receive end.

Figure 2:
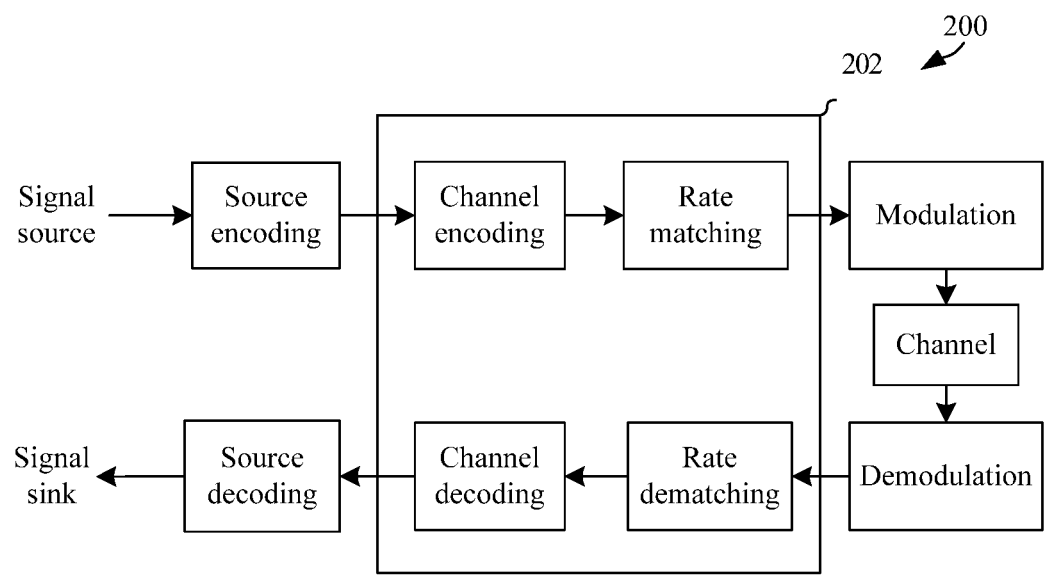
FIG. 2 is a schematic diagram of a basic procedure of wireless communication according to an embodiment of the present disclosure.

FIG. 2 shows a basic procedure of wireless communication. At a transmit end, a signal source is sent after source encoding, channel encoding, rate matching, and modulation are sequentially performed. At a receive end, a signal sink is output after demodulation, rate dematching, channel decoding, and source decoding are sequentially performed. Channel encoding and decoding may be performed using a polar code. A code length of an original polar code (a mother code) is the integral power of 2. Therefore, during actual application, a polar code of any length needs to be implemented through rate matching. At the transmit end, rate matching is performed after channel encoding, to implement any target code length. At the receive end, rate dematching is performed before channel decoding. It should be noted that the basic procedure of wireless communication further includes extra procedures (such as precoding and interleaving). These extra procedures are common knowledge to a person skilled in the art. Therefore, these extra procedures are not enumerated.

To improve performance of the polar code, an information bit set is usually checked and precoded, and then polar encoding is performed. Currently, the polar code includes a conventional Arikan polar code, a cyclic redundancy check (CRC)-aided (CRC-aided, or CA) polar code, a parity check (PC) polar code, and a PC-CA polar code. For a polar encoding/decoding method and an encoding/decoding apparatus that are used in this application, the conventional polar code, the CA polar code, or the PC polar code may be used.

Figure 3:
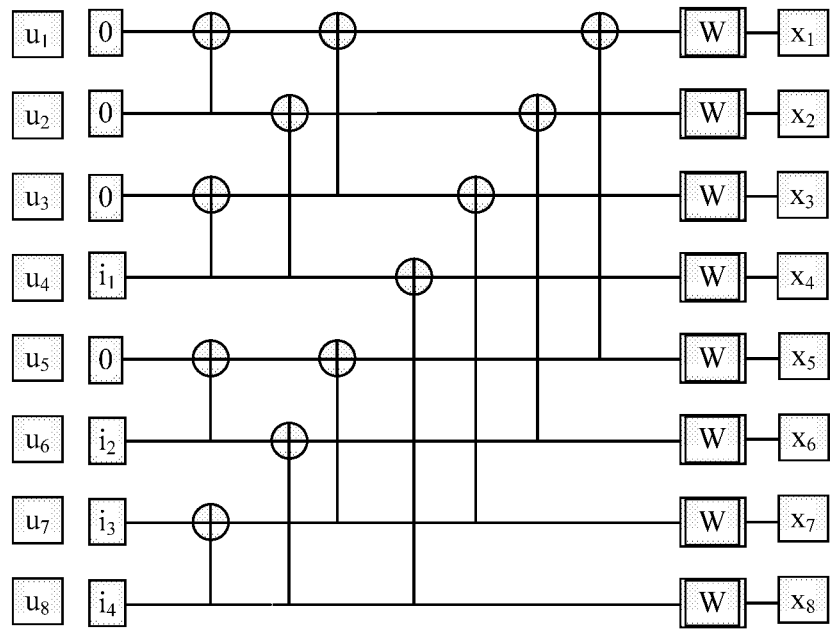
FIG. 3 is a schematic diagram of construction of a polar code according to an embodiment of the present disclosure.

To describe the conventional polar code in FIG. 3, $\{u1, u2, u3, u5\}$ is set as a frozen bit set, $\{u4, u6, u7, u8\}$ is set as an information bit set, and four information bits in an information vector whose length is 4 are encoded into eight encoded bits.

Figure 4:
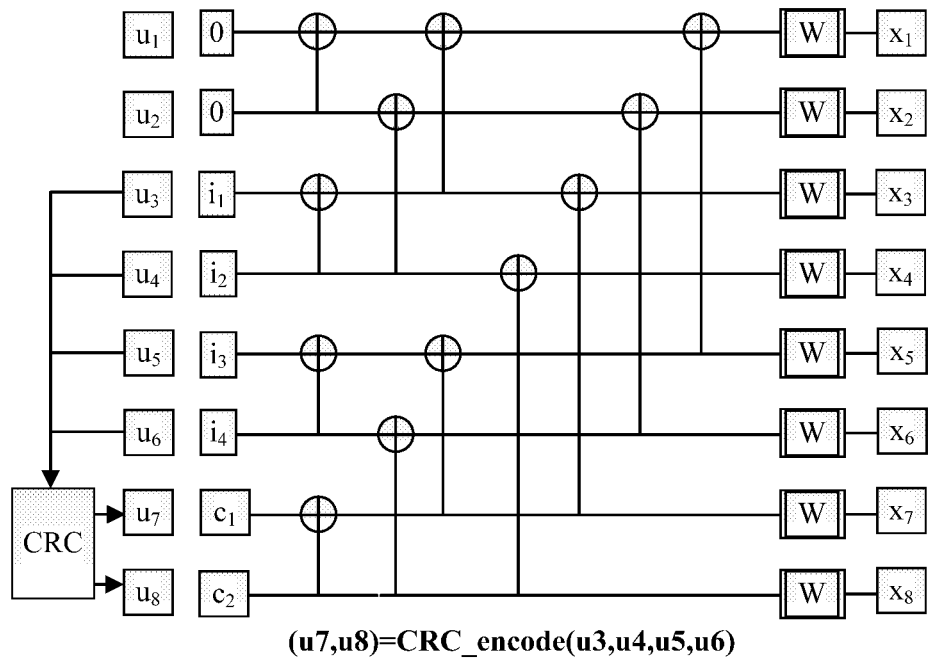
FIG. 4 is a schematic diagram of construction of a CA polar code according to an embodiment of the present disclosure.

To describe the CA polar code in FIG. 4, $\{u1, u2\}$ is set as a frozen bit set, $\{u3, u4, u5, u6\}$ is set as an information bit set, and $\{u7, u8\}$ is set as a CRC bit set. Values of $\{u7, u8\}$ are obtained after CRC is performed on $\{u3, u4, u5, u6\}$.

Figure 5:
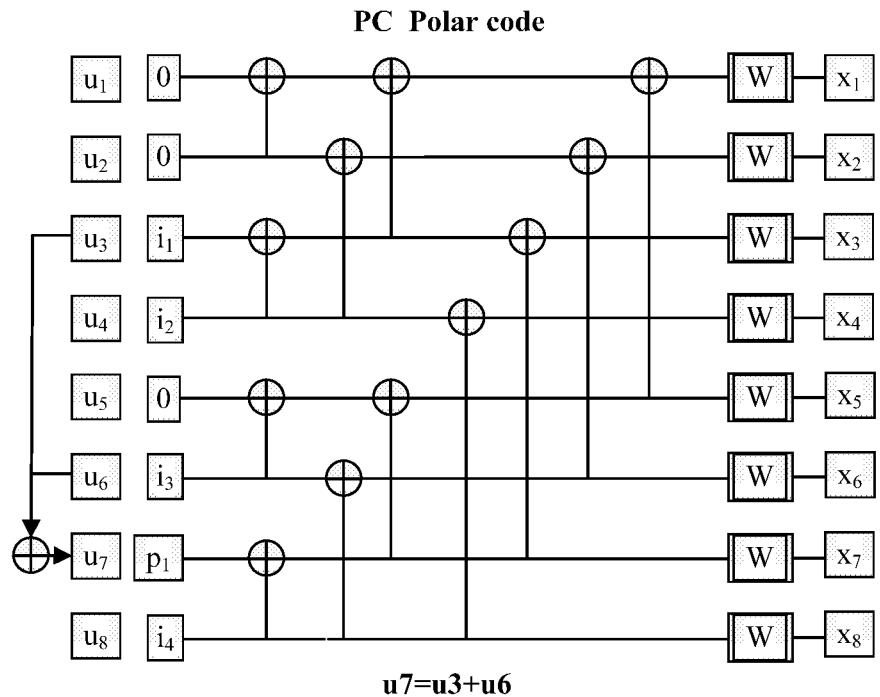
FIG. 5 is a schematic diagram of construction of a PC polar code according to an embodiment of the present disclosure.

To describe the PC polar code in FIG. 5, $\{u1, u2, u5\}$ is set as a frozen bit set, $\{u3, u4, u6, u8\}$ is set as an information bit set, and $\{u7\}$ is set as a PC frozen bit set. A value of $\{u7\}$ is obtained after exclusive OR is performed on $\{u3, u6\}$.

A most basic method for performing decoding using the polar code is Successive Cancellation (SC) decoding. However, performance of the algorithm is undesirable when a code length is limited. In a Successive Cancellation List (SCL) decoding algorithm that is put forward subsequently, decoding performance for a short code is improved through horizontal path extension and CRC check selection. Performance better than that for a Turbo code and a Low-Density Parity-Check code (LDPC) can be obtained according to the decoding algorithm when complexity is equivalent. The decoding method used in this embodiment of the present disclosure may be CA-SCL decoding. The CA-SCL decoding algorithm selects, through CRC check for decoding output, a path from candidate paths on which SCL decoding output is performed, where CRC succeeds on the path.

Figure 6:
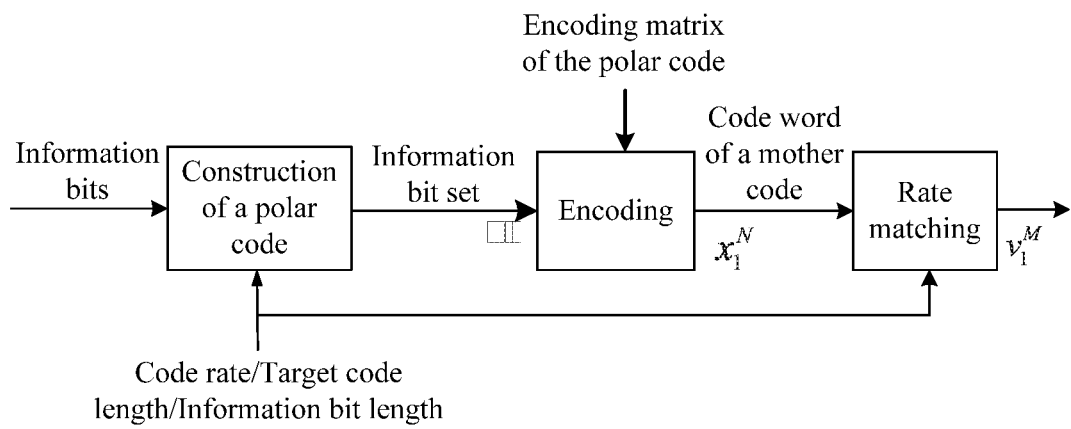
FIG. 6 is a schematic flowchart of performing encoding and rate matching using a polar code according to an embodiment of the present disclosure.

FIG. 6 is a schematic flowchart of performing encoding and rate matching using a polar code according to an embodiment of the present disclosure. First, the polar code is constructed based on a code rate, a target code length, and an information bit length. That is, indexes of K polarization channels that have highest reliability and that correspond to positions other than punctured or shortened positions are determined as elements of a set A based on the code rate, the target code length, and the information bit length using a polar code construction module. Information bits are encoded based on the set A and an encoding matrix of the polar code, to generate a mother code. Then, a proper rate matching manner is determined, and a rate matching operation is performed on a code word of the mother code, to obtain a target code word. When the rate matching manner is determined, a factor such as the target code length, the encoding matrix of the polar code, or the set A may be considered.

If a code length N of the mother code is less than the target code length M, it is determined that the rate matching manner may be repetition. If a code length N of the mother code is greater than the target code length M, it is determined that the rate matching manner may be puncturing or shortening (shorten). The rate matching manner in this embodiment of the present disclosure is puncturing or shortening (shorten).

The code length of the mother code in this embodiment of the present disclosure is N, and a sequence number of a polarization channel may range from 0 to N−1. If numbering starts from 1, the sequence number of the polarization channel is 1 to N. An example in which the sequence number of the polarization channel is 0 to N−1 is used for description in this embodiment of the present disclosure. In this embodiment of the present disclosure, a sending apparatus encodes to-be-sent information bits using the polar code, punctures or shortens encoded bits, and sends punctured or shortened encoded bits to a receiving apparatus. The receiving apparatus performs rate dematching on received soft information in the rate matching manner. The soft information is probability values indicating probabilities that encoded bits are determined as 0 and 1 at a receive end after noise is introduced. If a puncturing manner is used, decoding is performed after 0 is inserted at corresponding punctured positions. If a shortening manner is used, a relatively large value (a specific symbol is an actual encoded symbol) is inserted at corresponding shortened positions, and then decoding is performed.

In this embodiment of the present disclosure, the sending apparatus puncturing or shortening encoded bits includes determining to-be-punctured or to-be-shortened bit positions, and performing puncturing or shortening at the determined to-be-punctured or to-be-shortened bit positions. The to-be-punctured bit positions are bit positions corresponding to polarization channels 0 to $P_{T1}-1$, $P_{T1}$ to $3N/8-1$, and/or $N/2$ to $5N/8-1$. PT1 is a threshold of a quantity of to-be-punctured bit positions, and may be preset. For example, $P_{T1} \leq N/4$. The to-be-shortened bit positions are bit positions corresponding to polarization channels $N-1$ to $N-P_{T2}$, $N-P_{T2}-1$ to $5N/8$, and/or $N/2-1$ to $3N/8$. $P_{T2}$ is a threshold of a quantity of to-be-shortened bit positions, and may be preset. For example, $P_{T2} \leq N/4$. The following describes a process of determining the to-be-punctured bit positions or the to-be-shortened bit positions.

An example in which the rate matching manner is puncturing is used for description. $P_{T1}$ may be $N/16$, $N/8$, $3N/16$, $7N/32$, $5N/32$, or $3N/32$. If a puncturing quantity P1 is less than or equal to $P_{T1}$, the to-be-punctured bit positions are the bit positions corresponding to polarization channels 0 to P1−1. For example, a code length N is equal to 32, $P_{T1}=N/4=8$, and when the puncturing quantity P1 is less than or equal to 8, a puncturing priority order is {0, 1, 2, . . . , 7}, and the to-be-punctured bit positions are bit positions corresponding to polarization channels {0, 1, 2, . . . , 7}.

If a puncturing quantity P1 is greater than $P_{T1}$, the to-be-punctured bit positions are bit positions corresponding to the polarization channels 0 to $P_{T1}-1$, and bit positions corresponding to $P1-P_{T1}$ polarization channels that have lowest reliability among polarization channels $P_{T1}$ to $3N/8-1$ and/or $N/2$ to $5N/8-1$. For example, a code length N is equal to 32, $P_{T1}=N/4=8$, and an ascending order of reliability of polarization channels is as follows: Q32={0, 1, 2, 4, 8, 16, 3, 5, 6, 9, 10, 17, 12, 18, 20, 7, 24, 11, 13, 19, 14, 21, 22, 25, 26, 28, 15, 23, 27, 29, 30, 31}. When P1 is greater than 8, in addition to to-be-punctured bit positions corresponding to polarization channels 0 to 7, a remaining corresponding punctured area is bit positions corresponding to the polarization channels $P_{T1}$ to $3N/8-1$ and/or $N/2$ to $5N/8-1$, namely, bit positions corresponding to polarization channels {8 to 11, 16 to 19}. A reliability order of the polarization channels {8 to 11, 16 to 19} is as follows: {8, 16, 9, 10, 17, 18, 11, 19}. If a puncturing priority order is {0, 1, 2, . . . , 7, 8, 16, 9, 10, 17, 18, 11, 19}, the to-be-punctured bit positions are bit positions corresponding to the P1 polarization channels that have lowest reliability among polarization channels {0, 1, 2, . . . , 7, 8, 16, 9, 10, 17, 18, 11, 19}.

Alternatively, if a puncturing quantity P1 is greater than $P_{T1}$, the to-be-punctured bit positions are bit positions corresponding to the polarization channels 0 to $P_{T1}-1$, and bit positions corresponding to $P1-P_{T1}$ polarization channels included in K1 groups that have lowest reliability among S1 groups of polarization channels including polarization channels $P_{T1}$ to $3N/8-1$ and/or $N/2$ to $5N/8-1$. Reliability of the S1 groups of polarization channels corresponds to reliability of polarization channels 0 to $S1-1$ in polarization channels whose code length is a value that is closest to S1 and that is the integral power of 2. If S1 is equal to the integral power of 2, the value that is closest to S1 and that is the integral power of 2 is S1.

If a value of $N/2-P_{T1}$ is divisible by S1, a quantity of polarization channels included in each of the S1 groups is $(N/2-P_{T1})/S1$. For example, N=32, $P_{T1}=N/4=8$, S1=4, and a quantity of polarization channels in each group is 2. Grouping may be performed based on {8, 16}, {9, 10}, {17, 18}, and {11, 19}. A reliability order of polarization channels whose code length is 4 is as follows: Q4={0, 1, 2, 3}, and the following priority order of four punctured groups may be obtained: {{8, 16}, {9, 10}, {17, 18}, {11, 19}}.

Alternatively, if a value of $N/2-P_{T1}$ is indivisible by S1, a quantity of polarization channels included in one of the S1 groups is $(N/2-P_{T1})-\text{floor}((N/2-P_{T1})/S1)*(S1-1)$ or $(N/2-P_{T1})-\text{ceil}((N/2-P_{T1})/S1)*(S1-1)$, and a quantity of polarization channels included in each of the other corresponding S1−1 groups is $\text{floor}((N/2-P_{T1})/S1)$ or $\text{ceil}((N/2-P_{T1})/S1)$, where floor(i) represents rounding i down, and ceil(j) represents rounding j up. Alternatively, if a value of $N/2-P_{T1}$ is indivisible by S1, a quantity of polarization channels included in each of S1' groups is $\text{ceil}((N/2-P_{T1})/S1)$, and a quantity of polarization channels included in each of S1'' groups is $\text{floor}((N/2-P_{T1})/S1)$, where $S2''=\text{ceil}((N/2-P_{T1})/S1)*S1-(N/2-P_{T1})$, and $S1'=S1-S1.''$ For example, if N=32, $P_{T1}=N/4=8$, and S1=5, grouping may be performed based on {8, 16}, {9, 10}, {17, 16}, {17}, and {18}. The value that is closest to S1 and that is the integral power of 2 is 8 when S1 is 5. A reliability order of polarization channels whose code length is 8 is as follows: Q8={0, 1, 2, 4, 3, 6, 7}, and an order of polarization channels 0 to 4 is as follows: {0, 1, 2, 4, 3}. Therefore, the following priority order of five punctured groups may be obtained: {{8, 16}, {9, 10}, {17, 16}, {18}, {17}}.

A quantity of polarization channels included in the K1 groups is greater than or equal to $P1-P_{T1}$. The to-be-punctured bit positions are the bit positions corresponding to the polarization channels 0 to $PT1-1$, bit positions corresponding to all polarization channels in $K1-K_{n1}$ groups that have lowest reliability among the K1 groups, and bit positions corresponding to $P1-P_{T1}-P_{n1}$ polarization channels in $K_{n1}$ groups that have highest reliability among the K1 groups. $K_{n1}$ is greater than or equal to 0 and less than or equal to K1. If there is no repeated reliability in the K1 groups, $K_{n1}$ may be equal to K1. If a quantity of polarization channels included in the K1 groups is equal to $P1-P_{T1}$, $K_{n1}$ is equal to 0, and $P1-P_{T1}-P_{n1}=0$. $P_{n1}$ is a quantity of all polarization channels in the $K1-K_{n1}$ groups having lowest reliability. The $P1-P_{T1}-P_{n1}$ polarization channels may be selected from the $K_{n1}$ groups that have highest reliability among the K1 groups randomly or in an order. If a quantity of polarization channels included in the K1 groups is equal to $P1-P_{T1}$, the to-be-punctured bit positions are the bit positions corresponding to the polarization channels 0 to $P_{T1}-1$, and bit positions corresponding to all the polarization channels included in the K1 groups. For example, N=32, $P_{T1}=N/4=8$, S1=4, and a quantity of polarization channels in each group is 2. Grouping is performed based on {8, 16}, {9, 10}, {17, 18}, and {11, 19}. A reliability order of polarization channels whose code length is 4 is as follows: Q4={0, 1, 2, 3}, and the following priority order of four punctured groups may be obtained: {{8, 16}, {9, 10}, {17, 18}, {11, 19}}. If a puncturing quantity is 10, and K1=1, sequence numbers corresponding to the to-be-punctured bit positions are {0, 1, 2, . . . , 7, 8, 16}. For example, N=32, $P_{T1}=N/4=8$, S1=4, and a quantity of polarization channels in each group is 2. Grouping is performed based on {8, 16}, {9, 10}, {17, 18}, and {11, 19}. A reliability order of polarization channels whose code length is 4 is as follows: Q4={0, 1, 2, 3}, and the following priority order of four punctured groups may be obtained: {{8, 16}, {9, 10}, {17, 18}, {11, 19}}. If a puncturing quantity is 11, and K1=2, the to-be-punctured bit positions are {0, 1, 2, ..., 7, 8, 16, 9} or {0, 1, 2, ..., 7, 8, 16, 10}.

Alternatively, if a puncturing quantity P1 is greater than $P_{T1}$, the to-be-punctured bit positions are the bit positions corresponding to the polarization channels 0 to $P_{T1}-1$, and bit positions corresponding to P1-$P_{T1}$ polarization channels included in K2 groups that have a lowest code weight among S2 groups of polarization channels including the polarization channels $P_{T1}$ to 3N/8-1 and/or N/2 to 5N/8-1. A quantity of polarization channels included in the S2 groups is similar to that of the polarization channels included in the S1 groups. For details, refer to the foregoing descriptions. The details are not described herein again. A quantity of polarization channels included in the K2 groups is greater than or equal to P1-$P_{T1}$. The to-be-punctured bit positions are the bit positions corresponding to the polarization channels 0 to $P_{T1}-1$, bit positions corresponding to all polarization channels in K2-$K_{n2}$ groups that have a lowest code weight among the K2 groups, and bit positions corresponding to P1-$P_{T1}$-$P_{n2}$ polarization channels in $K_{n2}$ groups that have a highest code weight among the K2 groups. $K_{n2}$ is greater than or equal to 0 and less than or equal to K2. If a quantity of polarization channels included in the K2 groups is equal to P1-$P_{T1}$, $K_{n2}$ is equal to 0, and P1-$P_{T1}$-$P_{n2}$=0. $P_{n2}$ is a quantity of all polarization channels in the K2-$K_{n2}$ groups having the lowest code weight. The P1-$P_{T1}$-$P_{n2}$ polarization channels may be selected, randomly or in an order, for example, in ascending order of sequence numbers of the polarization channels, from the $K_{n2}$ groups that have the highest code weight among the K2 groups. A code weight is a row weight of a corresponding encoding matrix. For example, code weights of a polarization channel {0, 1, 2, 4, 3, 5, 6, 7} are the same, and if these code weights corresponding to the polarization channel are {1, 2, 2, 4, 2, 4, 4, 8}, a puncturing priority order is as follows: {0, 1, 2, 4, 3, 5, 6, 7}. If a quantity of polarization channels included in the K2 groups is equal to P1-$P_{T1}$, the to-be-punctured bit positions are the bit positions corresponding to the polarization channels 0 to $P_{T1}-1$, and bit positions corresponding to all the polarization channels included in the K2 groups.

An example in which the rate matching manner is shortening is used for description. $P_{T2}$ may be N/16, N/8, 3N/16, 7N/32, 5N/32, or 3N/32. If a shortening quantity P2 is less than or equal to $P_{T2}$, the to-be-shortened bit positions are bit positions corresponding to polarization channels N-1 to N-2.

If a shortening quantity P2 is greater than $P_{T2}$, the to-be-shortened bit positions are the bit positions corresponding to the polarization channels N-1 to N-$P_{T2}$, and bit positions corresponding to P2-$P_{T2}$ polarization channels that have highest reliability among polarization channels N/8 to N-$P_{T2}$ and/or 3N/8 to N/2-1.

Alternatively, if a shortening quantity P2 is greater than $P_{T2}$, the to-be-shortened bit positions are the bit positions corresponding to the polarization channels N-1 to N-$P_{T2}$, and bit positions corresponding to P2-$P_{T2}$ polarization channels included in K3 groups that have highest reliability among S3 groups of polarization channels including polarization channels N-$P_{T2}$-1 to 5N/8 and/or N/2-1 to 3N/8. Reliability of the S3 groups of polarization channels corresponds to reliability of polarization channels 0 to S3-1 in polarization channels whose code length is a value that is closest to S3 and that is the integral power of 2. If a value of N/2-$P_{T2}$ is divisible by S3, a quantity of polarization channels included in each of the S3 groups is (N/2-$P_{T2}$)/S3. If a value of N/2-$P_{T2}$ is indivisible by S3, a quantity of polarization channels included in one of the S3 groups is (N/2-$P_{T2}$)-floor((N/2-$P_{T2}$)/S3)*(S3-1) or (N/2-$P_{T2}$)-ceil((N/2-$P_{T2}$)/S3)*(S3-1), and correspondingly, a quantity of polarization channels included in each of the other S3-1 groups is floor((N/2-$P_{T2}$)/S3) or ceil((N/2-$P_{T2}$)/S3), where floor(i) represents rounding i down, and ceil(j) represents rounding j up. Alternatively, if a value of N/2-$P_{T2}$ is indivisible by S3, S3=S3'+S3." A quantity of polarization channels included in each of S3' groups is ceil((N/2-$P_{T2}$)/S3), and a quantity of polarization channels included in each of S3" groups is floor((N/2-$P_{T2}$)/S3), where S3"=ceil((N/2-$P_{T2}$)/S3)*S3-(N/2-$P_{T2}$), and S3'=S3S3."

A quantity of polarization channels included in the K3 groups is greater than or equal to $P_2$-$P_{T2}$. The to-be-shortened bit positions are the bit positions corresponding to the polarization channels N-1 to N-$P_{T2}$, bit positions corresponding to all polarization channels in K3-$K_{n3}$ groups that have highest reliability among the K3 groups, and bit positions corresponding to P2-$P_{T2}$-$P_{n3}$ polarization channels in $K_{n3}$ groups that have lowest reliability among the K3 groups. $K_{n3}$ is greater than or equal to 0 and less than or equal to K1. If the quantity of polarization channels included in the K3 groups is equal to P2-$P_{T2}$, $K_{n3}$ is equal to 0, and P2-$P_{T2}$-$P_{n3}$0. If there is no repeated reliability in the K3 groups, $K_{n3}$ is equal to 1. $P_{n3}$ is a quantity of all polarization channels in the K3-$K_{n3}$ groups having highest reliability. The P2-$P_{T2}$-$P_{n3}$ polarization channels may be selected from the $K_{n3}$ groups that have lowest reliability among the K3 groups randomly or in an order. If the quantity of polarization channels included in the K3 groups is equal to P2-$P_{T2}$, the to-be-shortened bit positions are the bit positions corresponding to the polarization channels N-1 to N-$P_{T2}$, and bit positions corresponding to all polarization channels included in the K3 groups.

Alternatively, if a shortening quantity P2 is greater than $P_{T2}$, the to-be-shortened bit positions are the bit positions corresponding to the polarization channels N-1 to N-$P_{T2}$, and bit positions corresponding to P2-$P_{T2}$ polarization channels included in K4 groups that have a highest code weight among S4 groups of polarization channels including polarization channels $P_{T2}$ to 3N/8-1 and/or N/2 to 5N/8-1. For a quantity of polarization channels included in the S4 groups, refer to the foregoing descriptions. Details are not described herein again. The quantity of polarization channels included in the K4 groups is greater than or equal to P2-$P_{T2}$. The to-be-shortened bit positions are the bit positions corresponding to the polarization channels N-1 to N-$P_{T2}$, bit positions corresponding to all polarization channels in K4-$K_{n4}$ groups that have a highest code weight among the K4 groups, and bit positions corresponding to P2-$P_{T2}$-$P_{n4}$ polarization channels in $K_{n4}$ groups that have a lowest code weight among the K4 groups. $K_{n4}$ is greater than or equal to 0 and less than or equal to K4. If the quantity of polarization channels included in the K4 groups is equal to P2-$P_{T2}$, $K_{n4}$ is equal to 0, and P2-$P_{T2}$-$P_{n4}$=0. $P_{n4}$ is a quantity of all polarization channels in the K4-$K_{n4}$ groups having the highest code weight. The P2-$P_{T2}$-$P_{n4}$ polarization channels may be selected, randomly or in an order, for example, in descending order of sequence numbers of the polarization channels, from the $K_{n4}$ groups that have the lowest code weight among the K4 groups. A code weight is a row weight of a corresponding encoding matrix. If the quantity of polarization channels included in the K4 groups is equal to P2–$P_{T2}$, the to-be-shortened bit positions are the bit positions corresponding to the polarization channels N–1 to N–$P_{T2}$, and bit positions corresponding to all polarization channels included in the K4 groups.

Based on the descriptions of the method for determining the to-be-punctured bit positions or the to-be-shortened bit positions, an embodiment of the present disclosure provides a rate matching method, as shown in FIG. 7. The rate matching method provided in this embodiment of the present disclosure includes the following steps.

Step 701: A sending apparatus performs encoding using a polar code, to obtain a first encoded sequence whose length is N. A sequence number of a polarization channel may range from 0 to N–1.

An example in which the sequence number of the polarization channel starts to be numbered from 0 is used in this embodiment of the present disclosure. Numbering may alternatively start from 1. Details are not described herein again.

Step 703: The sending apparatus determines P1 to-be-punctured bit positions or P2 to-be-shortened bit positions, and performs puncturing at the P1 bit positions or performs shortening at the P2 bit positions in the first encoded sequence to obtain rate-matched encoded bits.

The P1 to-be-punctured bit positions are bit positions corresponding to polarization channels 0 to $P_{T1}$–1, $P_{T1}$ to 3N/8–1, and/or N/2 to 5N/8–1, $P_{T1}$ is a threshold of a quantity of to-be-punctured bit positions, and $P_{T1} \leq N/4$. The P2 to-be-shortened bit positions are bit positions corresponding to polarization channels N–1 to N–$P_{T2}$, N–$P_{T2}$–1 to 5N/8, and/or N/2–1 to 3N/8, $P_{T2}$ is a threshold of a quantity of to-be-shortened bit positions, and $P_{T2} \leq N/4$.

The P1 to-be-punctured bits or the P2 to-be-shortened bits may be determined based on the foregoing descriptions. Details are not described herein again.

Step 705: Send the rate-matched encoded bits.

A receiving apparatus performs rate dematching on received soft information in the rate matching manner. The receiving apparatus determines the P1 to-be-punctured bit positions or the P2 to-be-shortened bit positions. A specific determining manner is the same as that of the sending apparatus. Details are not described herein again. If the rate matching manner is a puncturing manner, the receiving apparatus performs decoding after inserting 0 at corresponding punctured positions. If the rate matching manner is a shortening manner, the receiving apparatus inserts a relatively large value (a specific symbol is an actual encoded symbol) at corresponding shortened positions and then performs decoding.

Based on the rate matching solution provided in this embodiment of the present disclosure, reliability of polarization channels corresponding to the rate-matched encoded bits does not need to be calculated again, thereby reducing complexity, avoiding a performance loss in a puncturing/shortening process, and improving rate matching performance.

FIG. 8 shows a sending apparatus 800 according to an embodiment of the present disclosure. The sending apparatus 800 is configured to implement a rate matching function. The sending apparatus 800 includes an encoding unit 802, a rate matching unit 804, and a sending unit 806.

The encoding unit 802 is configured to perform encoding using a polar code, to obtain a first encoded sequence whose length is N. A sequence number of a polarization channel may range from 0 to N–1.

The rate matching unit 804 is configured to determine P1 to-be-punctured bit positions or P2 to-be-shortened bit positions, and perform puncturing at the P1 bit positions or shortening at the P2 bit positions in the first encoded sequence to obtain rate-matched encoded bits.

The P1 to-be-punctured bit positions are bit positions corresponding to polarization channels 0 to $P_{T1}$–1 to 3N/8–1, and/or N/2 to 5N/8–1, $P_{T1}$ is a threshold of a quantity of to-be-punctured bit positions, and $P_{T1} \leq N/4$. The P2 to-be-shortened bit positions are bit positions corresponding to polarization channels N–1 to N–$P_{T2}$, N–$P_{T2}$–1 to 5N/8, and/or N/2–1 to 3N/8, $P_{T2}$ is a threshold of a quantity of to-be-shortened bit positions, and $P_{T2} \leq N/4$.

The P1 to-be-punctured bits or the P2 to-be-shortened bits may be determined based on the foregoing descriptions. Details are not described herein again.

The sending unit 806 is configured to send the rate-matched encoded bits.

The sending apparatus 800 is configured to perform the method in the foregoing embodiments. For details of related descriptions, refer to the descriptions in the foregoing method embodiments. Details are not described herein again. During specific implementation, the encoding unit and the rate matching unit may be chips or integrated circuits, or the sending apparatus may be a chip or an integrated circuit.

Figure 9:
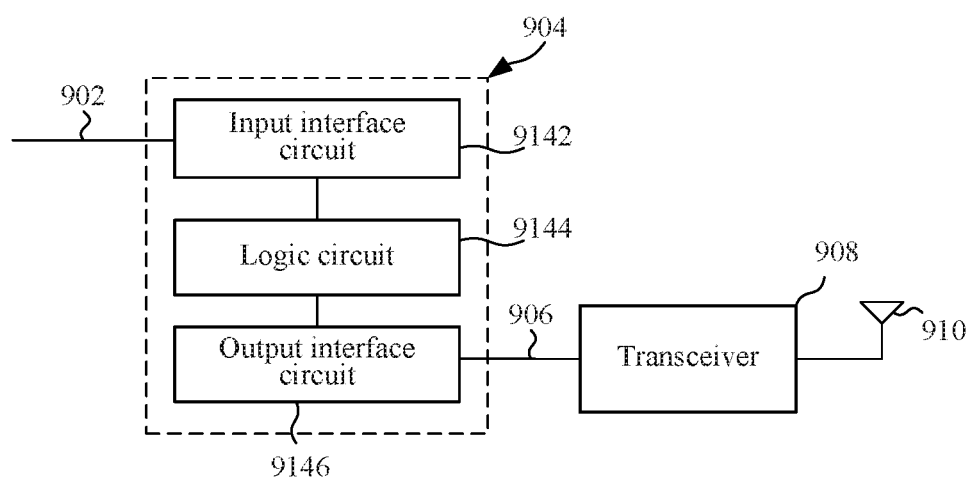
FIG. 9 is a schematic diagram of another sending apparatus according to an embodiment of the present disclosure.

An embodiment of the present disclosure further provides a sending apparatus. The sending apparatus may be implemented using hardware or software. When the sending apparatus is implemented using hardware, referring to FIG. 9, the sending apparatus includes an input interface circuit 9142, a logic unit 9144, and an output interface circuit 9146.

The input interface circuit 9142 is configured to obtain to-be-encoded bits.

The logic unit 9144 is configured to perform encoding using a polar code, to obtain a first encoded sequence whose length is N. A sequence number of a polarization channel may range from 0 to N–1. The logic unit 9144 is configured to determine P1 to-be-punctured bit positions or P2 to-be-shortened bit positions, and perform puncturing at the P1 bit positions or shortening at the P2 bit positions in the first encoded sequence to obtain rate-matched encoded bits.

The P1 to-be-punctured bit positions are bit positions corresponding to polarization channels 0 to $P_{T1}$–1 $P_{T1}$ to 3N/8–1, and/or N/2 to 5N/8–1, $P_{T1}$ is a threshold of a quantity of to-be-punctured bit positions, and $P_{T1} \leq N/4$. The P2 to-be-shortened bit positions are bit positions corresponding to polarization channels N–1 to N–$P_{T2}$, N–$P_{T2}$–1 to 5N/8, and/or N/2–1 to 3N/8, $P_{T2}$ is a threshold of a quantity of to-be-shortened bit positions, and $P_{T2} \leq N/4$.

The P1 to-be-punctured bits or the P2 to-be-shortened bits may be determined based on the foregoing descriptions. Details are not described herein again.

The input interface circuit 9146 is configured to send the rate-matched encoded bits.

The sending apparatus may be configured to perform the rate matching method shown in the foregoing method embodiments. For details, refer to the descriptions in the foregoing method embodiments. Details are not described herein again. During specific implementation, the sending apparatus may be a chip or an integrated circuit.

Figure 10A:
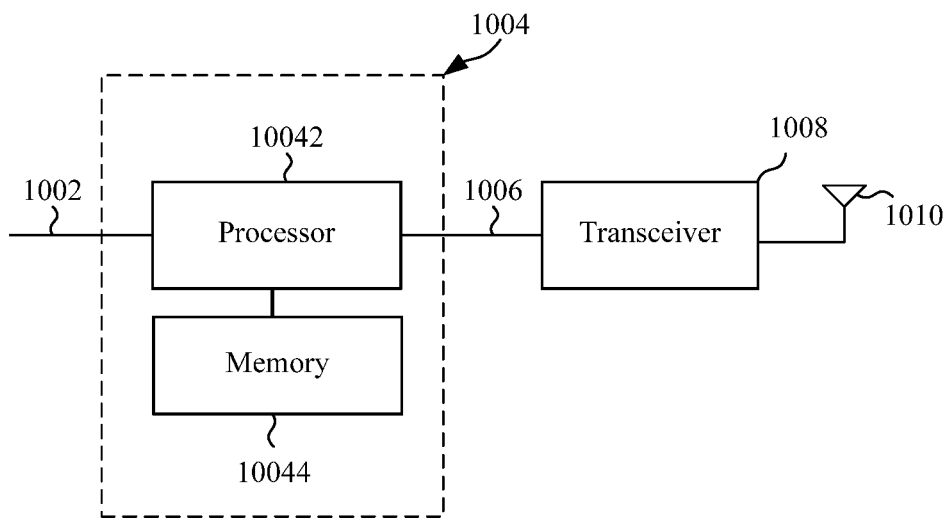
FIG. 10a and FIG. 10b are schematic diagrams of another sending apparatus according to an embodiment of the present disclosure.
Figure 10B:
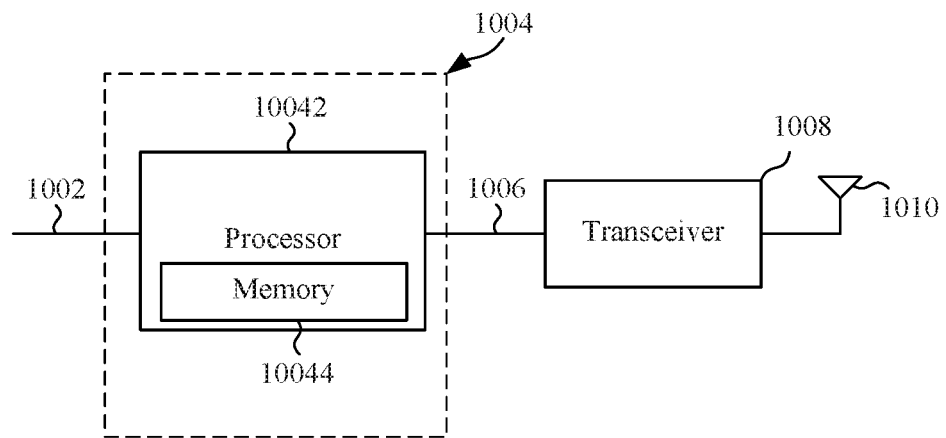

When the sending apparatus is implemented using software, referring to FIG. 10 *a* and FIG. 10*b*, the sending apparatus includes a memory 10044 and a processor 10042.

The memory 10044 is configured to store a program.

The processor 10042 is configured to execute the program stored in the memory. When the program is executed, the memory 10044 may be a physically independent unit, or may be integrated with the processor 10042.

The processor 10042 may be configured to perform the rate matching method shown in the foregoing method embodiments. For details, refer to the descriptions in the foregoing method embodiments. Details are not described herein again.

Figure 11:
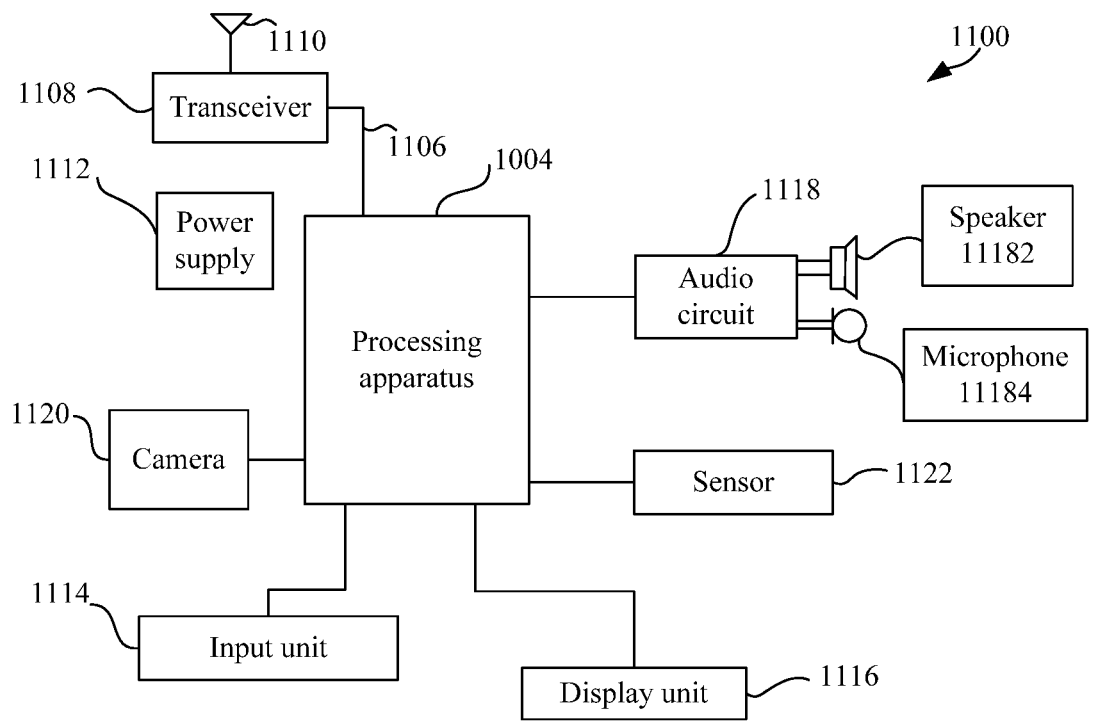
FIG. 11 is a schematic structural diagram of a terminal according to an embodiment of the present disclosure.

The sending apparatus may be a terminal or a network device. When the sending apparatus is a terminal, referring to FIG. 11, the terminal may further include a power supply 1112, configured to supply power to various devices or circuits in the terminal. The terminal may further include an antenna 1110, configured to send, using a radio signal, uplink data that is output by a transceiver, or output a received radio signal to a transceiver.

In addition, to improve functions of the terminal, the terminal may further include one or more of an input unit 1114, a display unit 1116, an audio circuit 1118, a camera 1120, a sensor 1122, or the like. The audio circuit may include a speaker 11182, a microphone 11184, and the like.

With reference to the foregoing descriptions, a person skilled in the art may be aware that the methods in the embodiments of this specification may be implemented by hardware (for example, a logic circuit), or software, or a combination of hardware and software. Whether the methods are performed by hardware or software depends on particular applications and design constraint conditions of the technical solutions. The person skilled in the art may use different methods to implement the described functions for each particular application, but it should not be considered that the implementation goes beyond the scope of this application.

When the functions are implemented in a form of software and are sold or used as independent products, the functions may be stored in a computer readable storage medium. In this case, the technical solutions of this application essentially, or the part contributing to conventional systems, or some of the technical solutions may be implemented in a form of a software product. The software product is stored in a storage medium, and includes several instructions for instructing a computer device (which may be a personal computer, a server, a network device, or the like) to perform all or some of the steps of the methods described in the embodiments of this application. The foregoing storage medium includes: any medium that can store program code, such as a Universal Serial Bus (USB) flash drive, a removable hard disk, a read-only memory (ROM), a random access memory (RAM), a magnetic disk, or an optical disc.

The foregoing descriptions are merely specific implementations of this application, but are not intended to limit the protection scope of this application. Any variation or replacement readily figured out by the person skilled in the art within the technical scope disclosed in this application shall fall within the protection scope of this application. Therefore, the protection scope of this application shall be subject to the protection scope of the claims.

What is claimed is:

1. A method, comprising:
    performing, by a sending apparatus, encoding using a polar code to obtain a first encoded sequence, wherein a length of the first encoded sequence is N and a sequence number of a polarization channel ranges from 0 to N−1, wherein N has a value equal to an integral power of 2;
    determining, by the sending apparatus, P1 to-be-punctured bit positions, and performing, by the sending apparatus, puncturing at the P1 bit positions in the first encoded sequence to obtain rate-matched encoded bits, wherein:
    the P1 to-be-punctured bit positions are bit positions corresponding to polarization channels 0 to $P_{T1}-1$, $P_{T1}$ to 3N/8−1, or N/2 to 5N/8−1;
    $P_{T1}$ is a threshold of a quantity of the to-be-punctured bit positions; and
    $P_{T1} \leq N/4$; and
    sending, by the sending apparatus using a transceiver of the sending apparatus, the rate-matched encoded bits.

2. The method according to claim 1, wherein $P_{T1}$ is N/16, N/8, 3N/16, 7N/32, 5N/32, or 3N/32.

3. The method according to claim 1, wherein based at least on P1 being greater than $P_{T1}$:
    the P1 to-be-punctured bit positions are:
        bit positions corresponding to polarization channels 0 to $P_{T1}-1$; and
        bit positions corresponding to $P_1-P_{T1}$ polarization channels that have a lowest reliability among polarization channels $P_{T1}$ to 3N/8−1 or N/2 to 5N/8−1; or
    the P1 to-be-punctured bit positions are:
        bit positions corresponding to polarization channels 0 to $P_{T1}-1$; and
        bit positions corresponding to P1−$P_{T1}$ polarization channels in K1 groups that have a lowest reliability among S1 groups of polarization channels that comprise polarization channels $P_{T1}$ to 3N/8−1 or N/2 to 5N/8−1; or
    the P1 to-be-punctured bit positions are:
        bit positions corresponding to polarization channels 0 to $P_{T1}-1$; and
        bit positions corresponding to P1−$P_{T1}$ polarization channels in K2 groups that have a lowest code weight among S2 groups of polarization channels that comprise polarization channels $P_{T1}$ to 3N/8−1 or N/2 to 5N/8−1.

4. The method according to claim 3, wherein:
    if a value of N/2−$P_{T1}$ is divisible by S1, a quantity of polarization channels in each of the S1 groups is (N/2−$P_{T1}$)/S1; or
    if a value of N/2−$P_{T1}$ is indivisible by S1, a quantity of polarization channels in one of the S1 groups is (N/2−$P_{T1}$)−floor((N/2−$P_{T1}$)/S1)*(S1−1) or (N/2−$P_{T1}$)−ceil((N/2−$P_{T1}$)/S1)*(S1−1), and a quantity of polarization channels in each of the other S1−1 groups is floor((N/2−$P_{T1}$)/S1) or ceil((N/2−$P_{T1}$)/S1), wherein floor(i) represents rounding i down, and ceil(j) represents rounding j up; or
    if a value of N/2−$P_{T1}$ is indivisible by S1, a quantity of polarization channels in each of S1' groups is ceil((N/2−$P_{T1}$)/S1), and a quantity of polarization channels in each of S1" groups is floor((N/2−$P_{T1}$)/S1), wherein S2"=ceil((N/2−$P_{T1}$)/S1)*S1−(N/2−$P_{T1}$), and S1'=S1−S1".

5. The method according to claim 4, wherein:
    the to-be-punctured bit positions are:
        the bit positions corresponding to the polarization channels 0 to $P_{T1}-1$;
        bit positions corresponding to all polarization channels in K1−$K_{n1}$ groups that have a lowest reliability among the K1 groups; and
        bit positions corresponding to P1−$P_{T1}$−$P_{n1}$ polarization channels in $K_{n1}$ groups that have a highest reliability among the K1 groups;
    wherein $K_{n1}$ is greater than or equal to 0 and less than or equal to K1, $P_{n1}$ is a quantity of all polarization channels in the K1−$K_{n1}$ groups, the P1−$P_{T1}$−$P_{n1}$ polarization channels are selected from the $K_{n1}$ groups randomly or in an order, and if a quantity of polarization channels in the K1 groups is equal to P1−$P_{T1}$, $K_{n1}$ is equal to 0, and P1−$P_{T1}$−$P_{n1}$=0; or the to-be-punctured bit positions are:
the bit positions corresponding to the polarization channels 0 to $P_{T1}$−1;
bit positions corresponding to all polarization channels in K2−$K_{n2}$ groups that have a lowest code weight among the K2 groups; and
bit positions corresponding to P1−$P_{T1}$−$P_{n2}$ polarization channels in $K_{n2}$ groups that have a highest code weight among the K2 groups;
wherein $K_{n2}$ is greater than or equal to 0 and less than or equal to K2, $P_{n2}$ is a quantity of all polarization channels in the K2−$K_{n2}$ groups, the P1−$P_{T1}$−$P_{n2}$ polarization channels are selected from the $K_{n2}$ groups randomly or in ascending order of sequence numbers of the polarization channels, and if a quantity of polarization channels in the K2 groups is equal to P1−$P_{T1}$, $K_{n2}$ is equal to 0, and P1−$P_{T1}$−$P_{n2}$=0.

6. The method according to claim 5, wherein based at least one P1 being less than or equal to $P_{T1}$, the P1 to-be-punctured bit positions are bit positions corresponding to polarization channels 0 to P1−1.

7. A sending apparatus, comprising:
a transceiver;
a non-transitory memory storage comprising instructions; and
a processor configured to communicate with the non-transitory memory storage, the processor configured to execute the instruction to:
perform encoding using a polar code to obtain a first encoded sequence, wherein a length of the first encoded sequence is N and a sequence number of a polarization channel ranges from 0 to N−1, wherein N has a value equal to an integral power of 2;
determine P1 to-be-punctured bit positions, and perform puncturing at the P1 bit positions in the first encoded sequence to obtain rate-matched encoded bits, wherein:
the P1 to-be-punctured bit positions are bit positions corresponding to polarization channels 0 to $P_{T1}$−1, $P_{T1}$ to 3N/8−1, or N/2 to 5N/8−1;
$P_{T1}$ is a threshold of a quantity of the to-be-punctured bit positions; and
$P_{T1}$≤N/4; and
send, using the transceiver, the rate-matched encoded bits.

8. The sending apparatus according to claim 7, wherein $P_{T1}$ is N/16, N/8, 3N/16, 7N/32, 5N/32, or 3N/32.

9. The sending apparatus according to claim 8, wherein based at least on P1 being greater than $P_{T1}$:
the P1 to-be-punctured bit positions are:
bit positions corresponding to polarization channels 0 to $P_{T1}$−1; and
bit positions corresponding to P1−$P_{T1}$ polarization channels that have a lowest reliability among polarization channels $P_{T1}$ to 3N/8−1 or N/2 to 5N/8−1; or
the P1 to-be-punctured bit positions are:
bit positions corresponding to polarization channels 0 to $P_{T1}$−1; and
bit positions corresponding to P1−$P_{T1}$ polarization channels in K1 groups that have a lowest reliability among S1 groups of polarization channels that comprise polarization channels $P_{T1}$ to 3N/8−1 or N/2 to 5N/8−1; or the P1 to-be-punctured bit positions are:
bit positions corresponding to polarization channels 0 to $P_{T1}$−1; and
bit positions corresponding to P1−$P_{T1}$ polarization channels in K2 groups that have a lowest code weight among S2 groups of polarization channels that comprise polarization channels $P_{T1}$ to 3N/8−1 or N/2 to 5N/8−1.

10. The sending apparatus according to claim 9, wherein:
if a value of N/2−$P_{T1}$ is divisible by S1, a quantity of polarization channels in each of the S1 groups is (N/2−$P_{T1}$)/S1; or
if a value of N/2−$P_{T1}$ is indivisible by S1, a quantity of polarization channels in one of the S1 groups is (N/2−$P_{T1}$)−floor((N/2−$P_{T1}$)/S1)*(S1−1) or (N/2−$P_{T1}$)−ceil((N/2−$P_{T1}$)/S1)*(S1−1), and a quantity of polarization channels in each of the other S1−1 groups is floor((N/2−$P_{T1}$)/S1) or ceil((N/2−$P_{T1}$)/S1), wherein floor(i) represents rounding i down, and ceil(j) represents rounding j up; or
if a value of N/2−$P_{T1}$ is indivisible by S1, a quantity of polarization channels in each of S1' groups is ceil((N/2−$P_{T1}$)/S1), and a quantity of polarization channels in each of S1" groups is floor((N/2−$P_{T1}$)/S1), wherein S2"=ceil((N/2−$P_{T1}$)/S1)*S1−(N/2−$P_{T1}$), and S1'=S1−S1".

11. The sending apparatus according to claim 9, wherein:
the to-be-punctured bit positions are:
the bit positions corresponding to the polarization channels 0 to $P_{T1}$−1;
bit positions corresponding to all polarization channels in K1−$K_{n1}$ groups that have a lowest reliability among the K1 groups; and
bit positions corresponding to P1−$P_{T1}$−$P_{n1}$ polarization channels in $K_{n1}$ is greater than or equal to 0 and less than or equal to K1, K1−$K_{n1}$ groups, the P1−$P_{T1}$−$P_{n1}$ polarization channels are selected from the $K_{n1}$ groups randomly or in an order, and if a quantity of polarization channels in the K1 groups is equal to P1−$P_{T1}$, $K_{n1}$ is equal to 0, and P1−$P_{T1}$−$P_{n1}$=0; or
the to-be-punctured bit positions are:
the bit positions corresponding to the polarization channels 0 to $P_{T1}$−1;
bit positions corresponding to all polarization channels in K2−$K_{n2}$ groups that have a lowest code weight among the K2 groups; and
bit positions corresponding to P1−PT1−$P_{n2}$ polarization channels in $K_{n2}$ groups that have a highest code weight among the K2 groups;
wherein $K_{n2}$ is greater than or equal to 0 and less than or equal to K2, $P_{n2}$ is a quantity of all polarization channels in the K2−$K_{n2}$ groups, the P1−$P_{T1}$−$P_{n2}$ polarization channels are selected from the $K_{n2}$ groups randomly or in ascending order of sequence numbers of the polarization channels, and if a quantity of polarization channels in the K2 groups is equal to P1−$P_{T1}$, $K_{n2}$ is equal to 0, and P1−$P_{T1}$−$P_{n2}$=0.

12. The sending apparatus according to claim 11, wherein based at least on P1 being less than or equal to $P_{T1}$, the P1 to-be-punctured bit positions are bit positions corresponding to polarization channels 0 to P1−1.

13. A method, comprising:
performing, by a sending apparatus, encoding using a polar code to obtain a first encoded sequence, wherein a length of the first encoded sequence is N and a sequence number of a polarization channel ranges from 0 to N−1, wherein N has a value equal to an integral power of 2;

determining, by the sending apparatus, P2 to-be-shortened bit positions, and performing, by the sending apparatus, shortening at the P2 bit positions in the first encoded sequence to obtain rate-matched encoded bits, wherein:

the P2 to-be-shortened bit positions are bit positions corresponding to polarization channels N−1 to N−$P_{T2}$, N−$P_{T2}$−1 to 5N/8, or N/2−1 to 3N/8;

$P_{T2}$ is a threshold of a quantity of the to-be-shortened bit positions; and $P_{T2}$≤N/4; and sending, by the sending apparatus using a transceiver of the sending apparatus, the rate-matched encoded bits.

14. The method according to claim 13, wherein $P_{T2}$ is N/16, N/8, 3N/16, 7N/32, 5N/32, or 3N/32.

15. The method according to claim 14, wherein based at least on P2 being greater than $P_{T2}$:

the P2 to-be-shortened bit positions are:
bit positions corresponding to polarization channels N−1 to N−$P_{T2}$; and
bit positions corresponding to P2−$P_{T2}$ polarization channels that have a highest reliability among polarization channels N−$P_{T2}$−1 to 5N/8 or N/2−1 to 3N/8; or the P2 to-be-shortened bit positions are:
bit positions corresponding to polarization channels N−1 to N−$P_{T2}$; and
bit positions corresponding to P2−$P_{T2}$ polarization channels in K3 groups that have a highest reliability among S3 groups of polarization channels that comprise polarization channels N−$P_{T2}$−1 to 5N/8 or N/2−1 to 3N/8; or the P2 to-be-shortened bit positions are:
bit positions corresponding to polarization channels N−1 to N−$P_{T2}$; and
bit positions corresponding to P2−$P_{T2}$ polarization channels in K4 groups that have a highest code weight among S4 groups of polarization channels that comprise polarization channels N−$P_{T2}$−1 to 5N/8 or N/2−1 to 3N/8.

16. The method according to claim 15, wherein:

if a value of N/2−$P_{T2}$ is divisible by S3, a quantity of polarization channels in each of the S3 groups is (N/2−$P_{T2}$)/S3; or if a value of N/2−$P_{T2}$ is indivisible by S3, a quantity of polarization channels in one of the S3 groups is (N/2−$P_{T2}$)−floor((N/2−$P_{T2}$)/S3)*(S3−1) or (N/2−$P_{T2}$)−ceil((N/2−$P_{T2}$)/S3)*(S3−1), and a quantity of polarization channels in each of the other S3−1 groups is floor((N/2−$P_{T2}$)/S3) or ceil((N/2−$P_{T2}$)/S3), wherein floor(i) represents rounding i down, and ceil(j) represents rounding j up; or if a value of N/2−$P_{T2}$ is indivisible by S3, a quantity of polarization channels in each of S3' groups is ceil((N/2−$P_{T2}$)/S3), and a quantity of polarization channels in each of S3" groups is floor((N/2−$P_{T2}$)/S3), wherein S3"=ceil((N/2−$P_{T2}$)/S3)*S3−(N/2−$P_{T2}$), and S3'=S3−S3".

17. The method according to claim 15, wherein:

the to-be-shortened bit positions are:
the bit positions corresponding to the polarization channels N−1 to N−$P_{T2}$;
bit positions corresponding to all polarization channels in K3−$K_{n3}$ groups that have a highest reliability among the K3 groups; and
bit positions corresponding to P2−$P_{T2}$−$P_{n3}$ polarization channels in $K_{n3}$ groups that have a lowest reliability among the K3 groups;
wherein $K_{n3}$ is greater than or equal to 0 and less than or equal to K3, $P_{n3}$ is a quantity of all polarization channels in the K3−$K_{n3}$ groups, the P2−$P_{T2}$−$P_{n3}$ polarization channels are selected from the $K_{n3}$ groups randomly or in an order, and if a quantity of polarization channels in the K3 groups is equal to P2−$P_{T2}$, $K_{n3}$ is equal to 0, and P2−$P_{T2}$−$P_{n3}$=0; or the to-be-shortened bit positions are:
the bit positions corresponding to the polarization channels N−1 to N−$P_{T2}$;
bit positions corresponding to all polarization channels in K4−$K_{n4}$ groups that have a highest code weight among the K4 groups; and
bit positions corresponding to P2−$P_{T2}$−$P_{n4}$ polarization channels in $K_{n4}$ groups that have a lowest code weight among the K4 groups;
wherein $K_{n4}$ is greater than or equal to 0 and less than or equal to K4, $P_{n4}$ is a quantity of all polarization channels in the K4−$K_{n4}$ groups, the P2−$P_{T2}$−$P_{n4}$ polarization channels may be selected from the $K_{n4}$ groups randomly or in descending order of sequence numbers of the polarization channels, and if a quantity of polarization channels in the K4 groups is equal to P2−$P_{T2}$, $K_{n4}$ is equal to 0, and P2−$P_{T2}$−$P_{n4}$=0.

18. The method according to claim 17, wherein based at least on P2 being less than or equal to $P_{T2}$, the P2 to-be-shortened bit positions are bit positions corresponding to polarization channels N−1 to N−P2.

19. A sending apparatus, comprising:
a transceiver;
a non-transitory memory storage comprising instructions; and
a processor configured to communicate with the non-transitory memory storage, the processor configured to execute the instruction to:
perform encoding using a polar code to obtain a first encoded sequence, wherein a length of the first encoded sequence is N and a sequence number of a polarization channel ranges from 0 to N−1, wherein N has a value equal to an integral power of 2;
determine P2 to-be-shortened bit positions, and perform shortening at the P2 bit positions in the first encoded sequence to obtain rate-matched encoded bits, wherein:
the P2 to-be-shortened bit positions are bit positions corresponding to polarization channels N−1 to N−$P_{T2}$, N−$P_{T2}$−1 to 5N/8, or N/2−1 to 3N/8;
$P_{T2}$ is a threshold of a quantity of the to-be-shortened bit positions; and
$P_{T2}$≤N/4; and
send, using the transceiver, the rate-matched encoded bits.

20. The sending apparatus according to claim 19, wherein $P_{T2}$ is N/16, N/8, 3N/16, 7N/32, 5N/32, or 3N/32.

* * * * *